United States Patent
Lee et al.

(10) Patent No.: US 6,262,470 B1
(45) Date of Patent: Jul. 17, 2001

(54) TRENCH-TYPE INSULATED GATE BIPOLAR TRANSISTOR AND METHOD FOR MAKING THE SAME

(75) Inventors: Kyu-hyun Lee; Tae-hoon Kim, both of Bucheon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/369,487

(22) Filed: Aug. 5, 1999

(30) Foreign Application Priority Data

Aug. 27, 1998 (KR) ................................................ 98-34881

(51) Int. Cl.[7] .................................................. H01L 27/082
(52) U.S. Cl. ...................... 257/565; 257/328; 257/329; 257/330; 257/331; 257/332
(58) Field of Search ...................... 257/139, 142, 257/145, 197, 212, 360, 370, 586, 587, 591, 592, 565, 328–332

(56) References Cited

U.S. PATENT DOCUMENTS 5,324,966 * 6/1994 Muraoka et al. .................... 257/136
5,705,835 * 1/1998 Nishiura et al. ..................... 257/147
5,751,024 * 5/1998 Takahashi ............................ 257/139

* cited by examiner

Primary Examiner—Nathan Flynn
Assistant Examiner—Scott R. Wilson
(74) Attorney, Agent, or Firm—Marger Johnson & McCollom, P.C.

(57) ABSTRACT

A trench-type insulated gate bipolar transistor in which a channel stop region is partially formed between an n-type high-concentration emitter region and a p-type base region in which a conductive channel is to be formed. The channel stop region is doped with p-type impurities at high concentration. A portion of the emitter region directly contact the base region, and the other portion has the channel stop region disposed between itself and the base region without directly contacting the base region. At the portion where the channel stop region is interposed, an electron current from the emitter region does not flow vertically into a drift region, but horizontally moves to a direct contacts portion between the emitter region and the base region and then vertically flows to the drift region via the conductive channel. The horizontally-flowing electron current within the emitter region causes a voltage drop, thus reducing the voltage difference at the junction between the emitter region and the base region. Therefore, a latch-up phenomenon, in which a parasitic thyristor is turned on, is suppressed.

3 Claims, 4 Drawing Sheets

TRENCH-TYPE INSULATED GATE BIPOLAR TRANSISTOR AND METHOD FOR MAKING THE SAME

BACKGROUND OF THE INVENTION

1. Field of the Invention

The present invention relates to a power semiconductor device and a method for making the same, and more particularly, to an insulated gate bipolar transistor (IGBT) having a trench-type insulated gate structure and a method for making the same.

2. Description of the Related Art

An IGBT, an insulated-gate type power semiconductor device has both the high-speed switching characteristics of a power MOSFET and the high-output characteristics of a BJT. Thus, recently, the IGBT has been increasingly used in power electronic devices such as inverters, converters, switching power suppliers, etc. In particular, a trench IGBT avoids the resistive component generated by the parasitic junction-type FET effect, which has been an obstacle to improved characteristics of planar IGBTs, because it has the small onresistance of a bipolar device.

FIG. 1 is a cross-sectional view of a conventional trench IGBT.

Referring to FIG. 1, an n-type high-concentration buffer layer 2 and an n-type low-concentration drift region 3 are sequentially formed on a p-type high-concentration semiconductor substrate 1 used as a collector area. A p-type base region 4 is formed on the upper surface of drift region 3, and an n-type high-concentration emitter region 5 is formed on part of the upper surface of the base region 4. A trench 6 is formed through the emitter region 5 and the base region 4, on part of drift region 3. A thin gate insulative layer 7 is formed on the inner wall of trench 6. A gate electrode 8, i.e., an impurity-doped polysilicon layer, is formed on gate insulative layer 7. Meanwhile, an emitter electrode 9 is formed so as to be electrically connected to base region 4 and emitter region 5. A collector electrode 10 is formed so as to be electrically connected to semiconductor substrate 1.

In this trench IGBT, a channel region is formed on the side wall of trench 6 within base region 4. That is, if a forward bias is applied to gate electrode 8, the conductive type of the side wall of trench 6 within base region 4 is inverted to form a channel. An electron current flows from the emitter region 5 to the drift region 3 through this channel. The electron current acts as a base current of a pnp transistor formed by base region 4, drift region 3, and semiconductor substrate 1. Corresponding to the electron current, a hole current flows from semiconductor substrate 1 to emitter electrode 9 via drift region 3 and base region 4.

However, the most significant problem of such a trench IGBT is a latch-up phenomenon. That is, a parasitic pnpn thyristor structure exists even in the trench IGBT, this pnpn structure being comprised of the emitter region 5, the base region 4, the drift region 3, and the semiconductor substrate 1. A voltage drop occurs in the lower portion of the emitter region 5 due to the hole current (indicated by arrows) flowing from the semiconductor substrate 1 to the base region 4 through the drift region 3. Thus, if the voltage difference between the base region 4 and the emitter region 5 increases to the extent (e.g., 0.7V) of conducting a pn junction ($J_1$), the parasitic pnpn thyristor operates to cause a latch-up. When latch-up occurs, the device can no longer be controlled by a gate voltage, and the device may become destroyed due to the flow of excessive current.

SUMMARY OF THE INVENTION

It is another object of the present invention to provide a method for making the trench IGBT.

According to a trench insulated gate bipolar transistor provided to achieve the first object, a second conductive drift region and a first conductive base region are sequentially formed on a first conductive semiconductor substrate used as a collector region. A channel stop region for partially limiting the vertical movement of a carrier via a conductive channel is formed on a predetermined upper portion of the base region. A second conductive emitter region is formed on a predetermined upper portion of the channel stop region. Some portion directly contacts the base region without passing through the channel stop region. Thus, a conductive channel can be formed only on the base region directly contacting the emitter region. A gate insulative layer is formed through the emitter region, the channel stop region, and the base region on the inner wall of a trench formed in a predetermined portion of the drift region. A gate electrode is formed on the gate insulative layer to fill the trench. An emitter electrode is formed so as to be electrically connected to the emitter region; and a collector electrode is formed so as to be electrically connected to the collector region.

Preferably, the channel stop region, doped with first conductive impurities at an impurity concentration that is higher than the first impurity concentration, is terminated at a predetermined distance from the sidewall of the trench, and has a portion protriding so as to contact the sidewall of the trench. Also, it is preferable that the emitter region is a pole-shaped emitter region formed along the sidewalls of the trench. Here, preferably, the pole-shaped emitter region is connected to an adjacent pole-shaped emitter region.

To achieve the second object, there is provided a method of manufacturing a trench insulated gate bipolar transistor according to the present invention. In this method, a second conductive drift region is formed on a first conductive semiconductor substrate used as a collector region. A first conductive base region is formed on a predetermined upper area of the drift region. A trench is formed through the base region and contacting a predetermined portion of the drift region. The trench is filled by sequentially forming a gate insulative layer and a gate conductive layer on the inner wall of the trench. A channel stop region is formed on a predetermined upper area of the base region, the channel stop region being a first conductive type and having a higher impurity concentration than the base region, so as to be selectively formed along the trench near the trench. A second conductive emitter region is formed on a predetermined upper area of the channel stop region, so as to selectively and directly contact the channel stop region along the trench at a portion where the channel stop region has been formed and to selectively and directly contact the base region along the trench at a portion where the channel stop region is not formed. An emitter electrode and a collector electrode are formed so as to be electrically connected to the emitter region and the semiconductor substrate, respectively.

According to the present invention, the amount of voltage drop due to an electron current in an emitter region is increased by forming a channel stop region between the emitter region and a base region along one section of the trench. On the other hand, the amount of voltage drop due to a hole current in the lower portion of the emitter region is decreased by doping the channel stop region with a high concentration p-type impurities. Thus, latch-up can be prevented.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENT

Hereinafter, a trench IGBT and a manufacturing method thereof according to a preferred embodiment of the present invention will be described in detail with reference to the attached drawings. However, the present invention is not limited to the embodiment and is can be modified into various other forms. The embodiments are provided to more completely explain the present invention and provide complete notification of the scope of the present invention to those skilled in the art.

Figure 1:
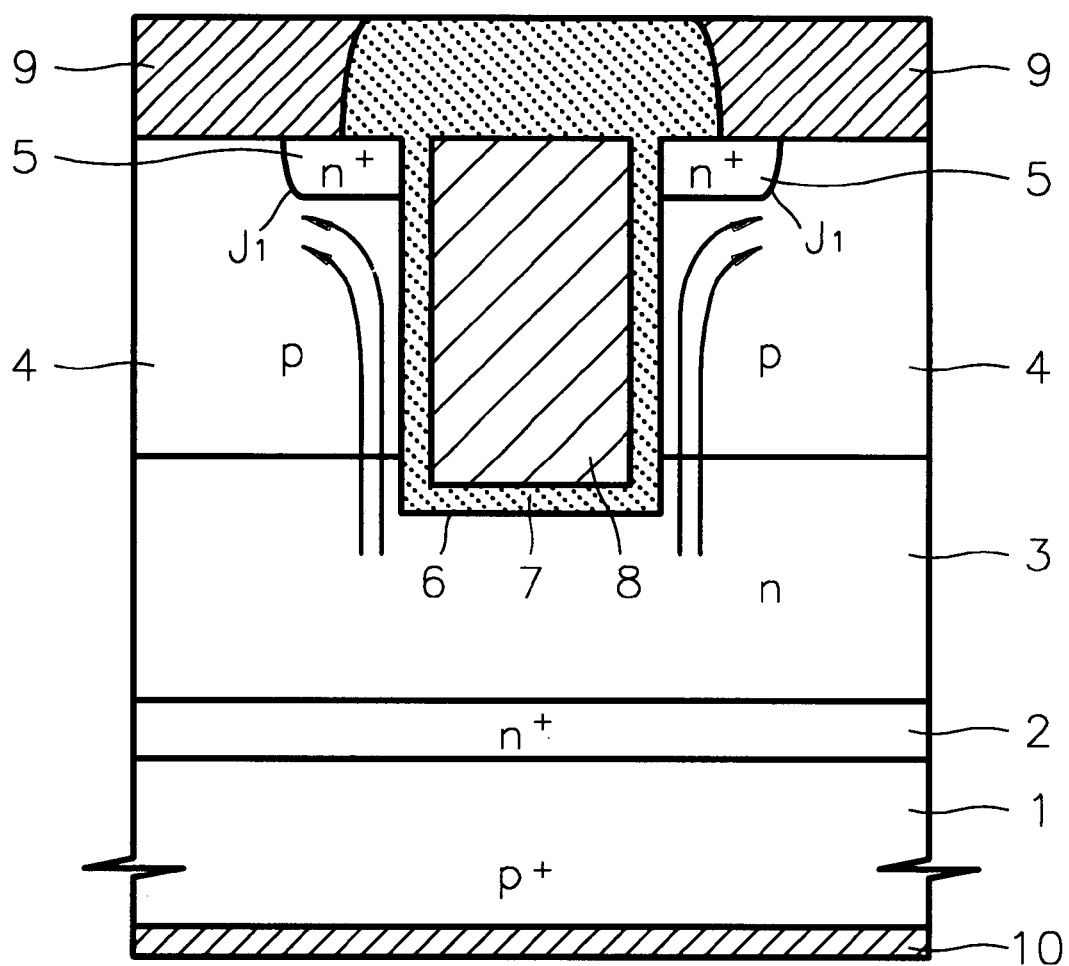
FIG. 1 is a cross-sectional view for explaining a latch-up phenomenon in a conventional trench IGBT (integrated gate bipolar transistor)
Figure 2:
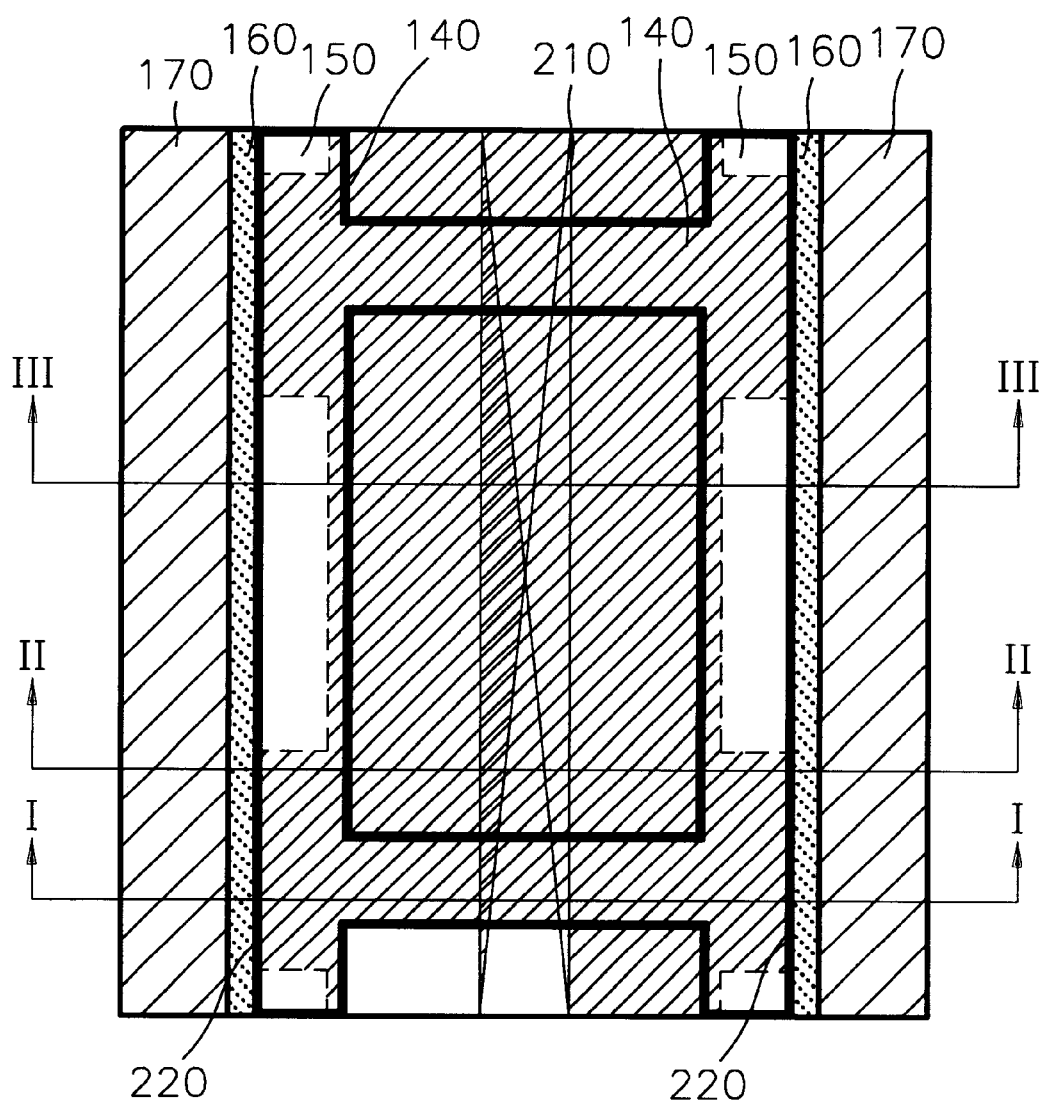
FIG. 2 drawn wit the emitter electrode 190 and the insulative layer 180 removed is a plan view of a trench IGBT according to the present invention.
Figure 3:
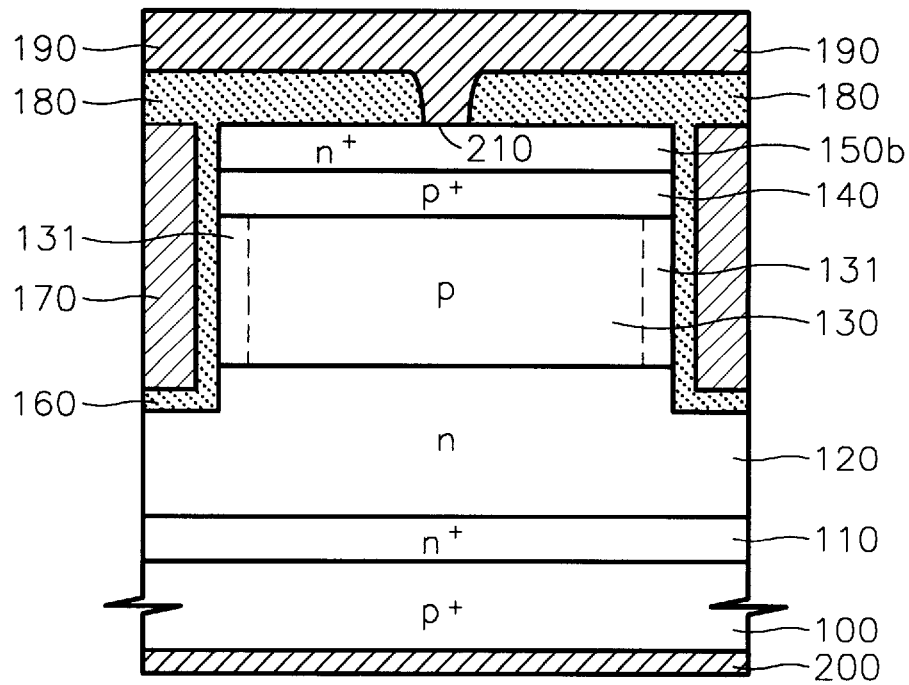
FIG. 3 is a cross-sectional view taken along line III–III' of FIG. 2.
Figure 4:
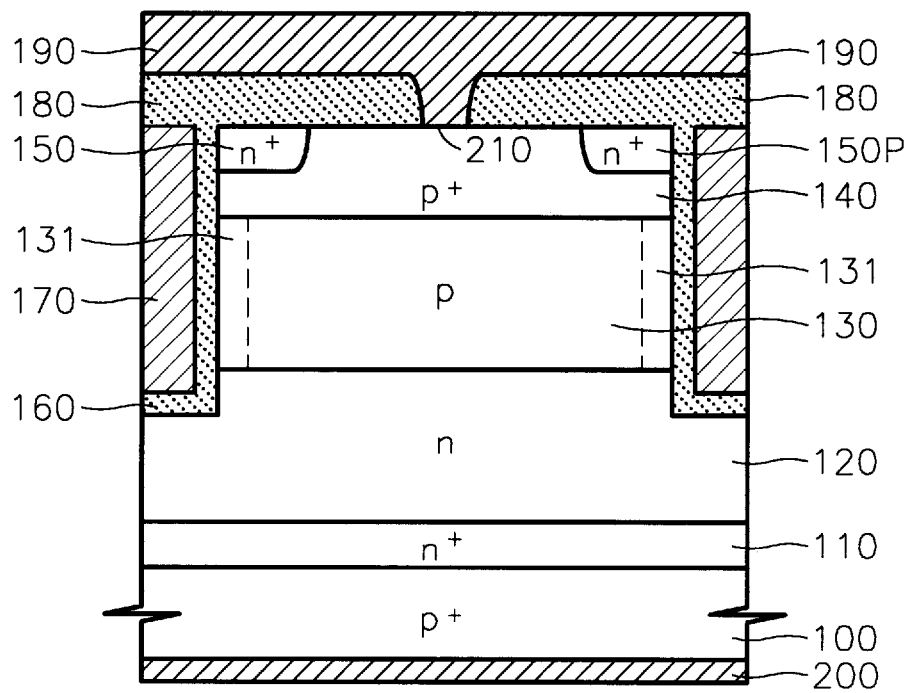
FIG. 4 is a cross-sectional view taken along line IV–IV' of FIG. 2.
Figure 5:
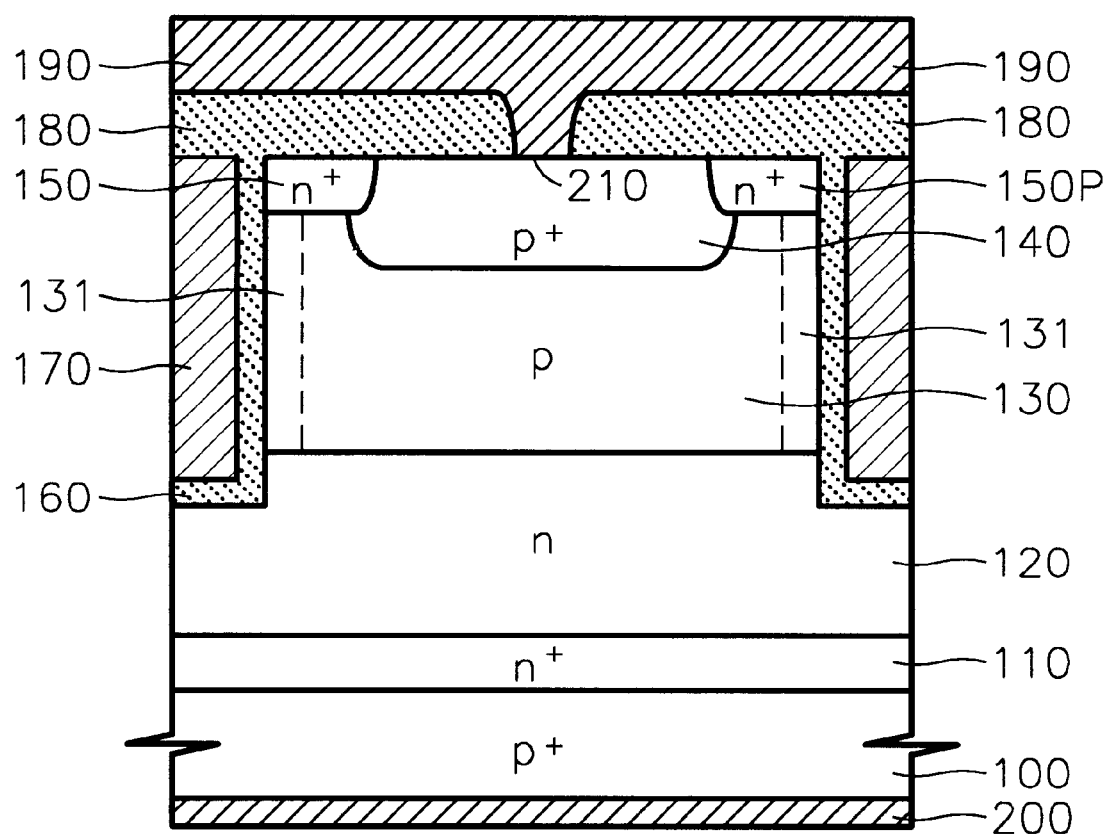
FIG. 5 is a cross-sectional view taken along line V–V' of FIG. 2.

FIG. 2 is a plan view of a trench IGBT (insulated gate bipolar transistor) according to the present invention. FIGS. 3 through 5 are cross-sectional views taken along lines III–III', IV–IV', and V–V' of FIG. 2, respectively. Like reference numerals in FIGS. 2 through 5 denote the same regions or elements.

Referring to FIGS. 3 through 5, an n-type buffer layer 110 and an n-type drift region 120 are sequentially formed on a p-type semiconductor substrate 100. Here, the p-type denotes a first conductive type, and the n-type denotes a second conductive type. The buffer layer 110 can reduce the thickness of the drift region 120 by preventing a depletion layer formed on the drift region 120 from extending to the semiconductor substrate 100, reducing on-state losses. The semiconductor substrate 100 used as a collector region, has a high impurity concentration, and the drift region 120 has a low impurity concentration. The buffer layer 110 has a higher impurity concentration than the drift region 120. A p-type base region 130 is formed on the drift region 120. A channel stop region 140 is formed on the base region 130. The channel stop region 140 is doped with a high concentration p-type impurities in order to partially limit the vertical movement of carriers via a conductive channel formed within the base region 130. An n-type emitter region is formed on the channel stop region 140. The emitter region is comprised of a pole-shaped emitter region 150p of FIGS. 4 and 5, and a bar-shaped emitter region 150b of FIG. 3 for connecting adjacent pole-shaped emitter regions 150p of a trench IGBT in a ladder shape.

A trench penetrates the base region 130, the channel stop region 140 and the emitter region 150 and penetrates into epitaxial region 120. A gate insulative layer 160 of a predetermined thickness is formed on the inner wall of the trench, and a gate electrode 170 filling the trench is formed on the gate insulative layer 160. The gate electrode 170 is formed of impurity-doped polysilicon. An emitter electrode 190, formed of metal, is electrically connected to the bar-shaped emitter region 150b by directly contacting part of the bar-shaped emitter region 150b through a contact hole 210 formed within the insulative layer 180. On the other hand, a collector electrode 200 is formed so as to be electrically connected to the semiconductor substrate 100.

Referring to FIG. 2, an emitter region 150, identified as the ladder shaped region surrounded by a thick solid line. That is, the emitter region 150 includes an elongated pole-shaped emitter region 150p contacting the sidewalls 220 of the trench, and a bar-shaped emitter region 150b for connecting adjacent pole-shaped emitter regions 150p to each other. The pole-shaped and bar-shaped emitter regions 150p and 150b intersect each other and form a ladder shape. The bar-shaped emitter region 150b is electrically connected to the emitter electrode 190 of FIGS. 3 through 5 via contact hole 210. Reference number 210, shown in FIG. 2, (crossed diagonal lines) also indicates a region in which a contact structure is to be formed. See FIG. 5.

A channel stop region 140, a slashed portion surrounded by a dotted line, partially limits carriers from vertically moving through a conductive channel that is vertically formed inside the base region 130 of FIGS. 3 through 5 along the trench sidewalls 220, as described above. In one area where the vertical movement of carriers via the conductive channel should be limited, the channel stop region 140 is formed so as to overlap with the emitter region 150 along the sidewall 220 of the trench, FIG. 3 and FIG. 4. Otherwise, the channel stop region 140 is terminated at a predetermined distance from the sidewall 220 of the trench, FIG. 5. The channel stop region 140 is interposed between the emitter region 150 and the base region 130 of FIGS. 3 through 5 such that a portion of channel stop region 140 overlaps emitter region 150. Even if a conductive channel is formed in the base region 130 of FIG. 3 and FIG. 4 at this portion, it does not directly contact the emitter region 150. A portion where the channel stop region 140 does not overlap the emitter region is where the emitter region 150 directly contacts the base region 130 of FIG. 5 at the sidewalls 220 of the trench. The conductive channel formed in the base region 130 of FIG. 5 directly contacts the emitter region 150 at this portion.

To be more specific, as shown in FIGS. 3 and 4, a conductive channel 131 is formed adjacent to the trench sidewalls within the base region 130 when a predetermined voltage is applied to a gate electrode 170. However, no conductive channel is formed adjacent to the trench sidewalls within the high-concentration channel stop region 140. Accordingly, an electron current generated by the emitter regions 150p and 150b cannot vertically flow to the drift region 120 via the conductive channel 131 in the area of base region 130 where the channel stop region 140 overlaps the emitter regions 150p and 150b. On the other hand, as shown in FIG. 5 where the channel stop region 140 does not overlap with the pole-shaped emitter region 150p, as a predetermined voltage is applied to the gate electrode 170, the conductive channel 131 is formed on the sidewalls of the trench within the base region 130 so as to directly contact the pole-shaped emitter region 150p. Thus, where no overlap exists, an electron current generated from the pole-shaped emitter region 150p can vertically flow to the drift region 120 via the conductive channel 131.

Accordingly, the electron current, emitted from the emitter regions 150p and 150b where the vertical movement of a carrier is limited by the channel stop region 140, flows horizontally to the conductive channel 131 of FIG. 5 in contact with the pole-shaped emitter region 150p. Then, the electron current flows to the drift region 120 via the conductive channel 131 of FIG. 5. As the moving path of the electron current becomes longer inside the emitter region 150, the resistance encountered within the emitter region 150 increases. The amount of voltage drop due to the electron current within the emitter region 150 also increases with such an increase in the resistance value. When the voltage drop within the emitter region 150 increases, the magnitude of a voltage applied to a pn junction between the emitter region 150 and the base region 130 decreases, so that the latch-up phenomenon is suppressed for the following reasons. A voltage $V_{be}$ ($=V_b-V_e$) is applied to the pn junction between the emitter region 150 and the base region 140, the voltage having a magnitude corresponding to the difference between a voltage drop (Vb) at the lower portion of the emitter region 150 due to a hole current from the drift region 120 and a voltage drop ($V_e$) within the emitter region 150 due to an electron current within the emitter region 150. In the present invention, as the voltage drop ($V_e$) within the emitter region 150 due to the electron current within the emitter region 150 increases, the voltage $V_{be}$ applied to the pn junction between the emitter region 150 and the base region 140 decreases. Also, since a p-type high-concentration impurity-doped region is used as the channel stop region 140, the lower portion of the emitter region 150 contacting the channel stop region 140 has a low resistance value. The low resistance value contributes to a reduction in the voltage drop ($V_b$) at the lower portion of the emitter region 150 due to the hole current from the drift region 120, so that a latch-up phenomenon can be easily suppressed.

A method of manufacturing an IBGT according to a preferred embodiment of the present invention will now be described referring to FIGS. 3 through 5.

First, an n-type drift region 120 is formed on a p-type semiconductor substrate 100 used as a collector region. An n-type high-concentration buffer layer 110 can be formed between the semiconductor substrate 100 and the drift region 120. A p-type base region 130 is formed on a given upper portion of the drift region 120, and a trench that penetrates region 130 and contacts a predetermined portion of the drift region 120 is then formed. A gate insulative layer 160 and a gate conductive layer 170 are sequentially formed on the inner wall of the trench, thereby completely filling the trench.

A p-type channel stop region 140 is formed in a selected portion of the base region 130. The channel stop region 140 is doped at a higher impurity concentration than the base region 130, and selectively formed along the trench at a portion adjacent to the trench. Then, n-type emitter regions 150p and 150b are formed on the selected portion of the channel stop region 140. In this case, at a portion where the channel stop region 140 is selectively formed along the trench, the n-type emitter regions 150p and 150b directly contact the channel stop region 140 as shown in FIGS. 3 and 4. At a portion where the channel stop region 140 is not formed along the trench, the n-type emitter regions 150p and 150b directly contact the base region 130 as shown in FIG. 5. An emitter electrode 190 and a collector electrode 200 are formed so as to be electrically connected to the emitter regions 150p and 150b and the semiconductor substrate 100, respectively.

What is claimed is:

1. A trench insulated gate bipolar transistor comprising:

a semiconductor substrate, of a first conductivity type, used as a collector region, said substrate having a surface;

a drift region, of a second conductivity type, overlying the semiconductor substrate;

a trench formed in the surface so as to contact the drift region;

a base region, of the first conductivity type, overlying the drift region, said base region being adjacent to the trench;

an emitter region, of the second conductivity type, overlying the base region;

a channel stop region interposed between the base and the emitter region along one section of the trench;

a gate insulative layer formed on the inner wall of the trench;

a gate electrode formed on the gate insulative layer;

an emitter electrode formed so as to be electrically connected to the emitter region; and a collector electrode formed so as to be electrically connected to the collector region, wherein a portion of the channel stop region overlaps the emitter region such that a conductive channel formed in the base region does not directly contact the emitter region while another portion of the channel stop region does not overlap the emitter region.

2. The trench insulated gate bipolar transistor as claimed in claim 1, wherein the channel stop region is doped with first conductive impurities at an impurity concentration that is higher than the impurity concentration of the base region.

3. The trench insulated gate bipolar transistor as claimed in claim 1, wherein the channel stop region is terminated at a predetermined distance from the sidewall of the trench along the remainder of the trench.

* * * * *

UNITED STATES PATENT AND TRADEMARK OFFICE
CERTIFICATE OF CORRECTION

PATENT NO. : 6,262,470 B1
DATED : July 17, 2001
INVENTOR(S) : Lee et al.

It is certified that error appears in the above-identified patent and that said Letters Patent is hereby corrected as shown below:

<u>Title page,</u>
The title "TRENCH-TYPE INSULATED GATE BIPOLAR TRANSISTOR AND METHOD FOR MAKING THE SAME" should read -- TRENCH-TYPE INSULATED GATE BIPOLAR TRANSISTOR --.
Item [57], ABSTRACT, "contact" should read -- contacts --.

<u>Column 2,</u>
Line 2, prior to "It is another object", insert -- To solve the above problems, it is an object of the present invention to provide a trench IGBT which can suppress the operation of a parasitic thyristor by reducing the magnitude of a voltage applied to a pn junction between an emitter region and a base region. --.
Line 27, "protriding" should read -- protruding --.

<u>Column 3,</u>
Line 6, "drawn wit" should read -- drawn with --.

<u>Column 5,</u>
Line 12, "(Vb)" should read -- ($V_b$) --.

Signed and Sealed this

Eleventh Day of June, 2002

Attest:

*Attesting Officer*

JAMES E. ROGAN
*Director of the United States Patent and Trademark Office*